United States Patent [19]
Slocum

[11] Patent Number: 5,036,278
[45] Date of Patent: Jul. 30, 1991

[54] RADIATION SOURCE FOR HELIUM MAGNETOMETERS

[75] Inventor: Robert E. Slocum, Richardson, Tex.

[73] Assignee: Polatomic, Inc., Richardson, Tex.

[21] Appl. No.: 414,909

[22] Filed: Sep. 29, 1989

[51] Int. Cl.[5] .......................................... G01R 33/26
[52] U.S. Cl. ............................................. 324/304
[58] Field of Search ............... 324/300, 301, 302, 304, 324/305

[56] References Cited

U.S. PATENT DOCUMENTS

| | | | |
|---|---|---|---|
| 3,071,721 | 2/1957 | Dehmelt | 324/0.5 |
| 3,122,702 | 2/1964 | Franken | 324/0.5 |
| 3,173,082 | 3/1965 | Bell et al. | 324/0.5 |
| 3,206,671 | 9/1965 | Colegrove et al. | 324/0.5 |
| 3,628,130 | 12/1971 | Schearer | 324/0.5 |
| 3,728,614 | 4/1973 | Hearn | 324/0.5 |
| 4,005,355 | 1/1977 | Happer et al. | 324/0.5 |
| 4,193,029 | 3/1980 | Cloccio et al. | 324/301 |
| 4,327,327 | 4/1982 | Greenwood et al. | 324/304 |
| 4,430,616 | 2/1984 | Grover | 324/304 |
| 4,525,672 | 6/1985 | Lam et al. | 324/304 |
| 4,567,439 | 1/1986 | McGregor | 324/304 |
| 4,780,672 | 10/1988 | McGregor | 324/304 |
| 4,814,707 | 3/1989 | Marton | 324/304 |

OTHER PUBLICATIONS

"Application of Helium Isotopes to a NMR Gyro", by Douglas D. McGregor, Dmetro Andrychuck and Robert E. Slocum, *SPIE*, vol. 157, Laser Inertial Rotation Sensors (1978) pp. 81–88.

"Evaluations of Frequency Shift and Stability in Rubidium Vapor Stabilized Semiconductor Lasers", by Hiroyuki Furuta and Motoichi Ohtsu, *Applied Optics*, Sep. 1989, vol. 28, No. 17, pp. 3737–3743.

*Primary Examiner*—Hezron E. Williams
*Assistant Examiner*—Louis M. Arana
*Attorney, Agent, or Firm*—Ross, Howison, Clapp & Korn

[57] ABSTRACT

A radiation source (12) for optical magnetometers (10) which use helium isotopes as the resonance element (30) includes an electronically pumped semiconductor laser (12) which produces a single narrow line of radiation which is frequency stabilized to the center frequency of the helium resonance line to be optically pumped. The frequency stabilization is accomplished using electronic feedback (34, 40, 42, 44) to control a current sources (20) thus eliminating the need for mechanical frequency tuning.

13 Claims, 1 Drawing Sheet

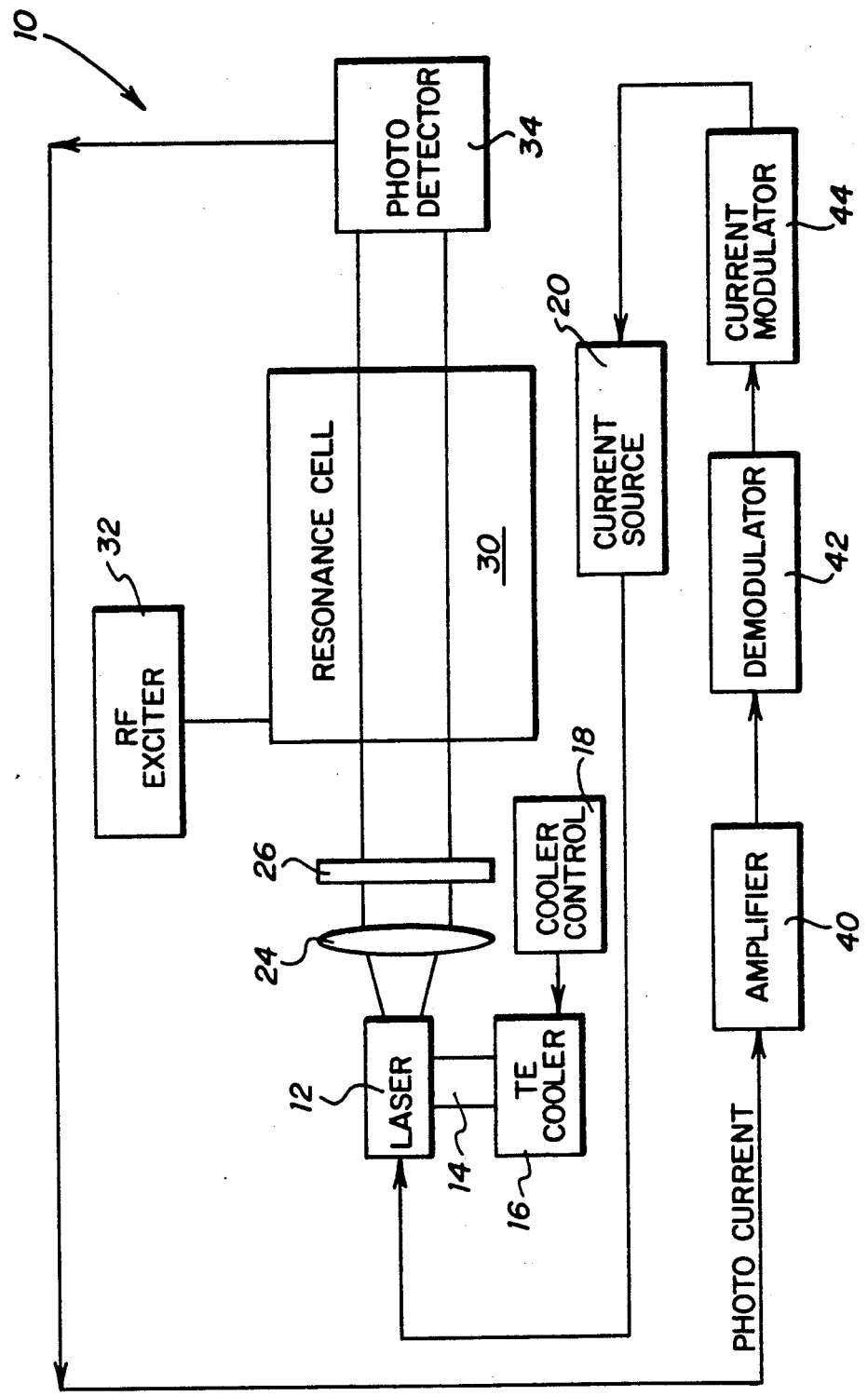

RADIATION SOURCE FOR HELIUM MAGNETOMETERS

This invention was made with government support under contract number N00024-88-C-5710 awarded by the Naval Sea Systems Command and contract number NAS7-993 awarded by NASA. The government has certain rights in this invention.

TECHNICAL FIELD OF THE INVENTION

The present invention relates to optical radiation sources for optical magnetometers which use helium isotopes as their resonance element, and more particularly, to an improved optical radiation source which utilizes a semiconductor laser.

BACKGROUND OF THE INVENTION

There are two typical radiation sources used for optical pumping of a magnetometer helium isotope resonance cell. Conventional helium isotope magnetometers use a helium lamp as a source of optical radiation for optically pumping the resonance cell and for optically observing the state of the helium isotope sample in the resonance cell. A second, more recent approach is the proposed use of a solid state laser radiation source.

A helium lamp when excited by electrical energy emits infrared radiation which is used for optical pumping and for monitoring of the helium isotope in the resonance cell. The radiation emitted by the helium lamp consists of three spectral lines at the approximate wavelength of 1083 nm which are designated respectively $D_0$, $D_1$, $D_2$. These spectral lines derive from transitions between the triplet P energy levels and the triplet S energy level. The $2S_1$ to $2P_0$, $2S_1$ to $2P_1$, and $2S_1$ to $2P_2$ transitions have center wavelengths of 1082.91 nm, 1083.01 nm and 1083.03 nm, respectively.

There are a number of disadvantages associated with helium lamp pumping. One disadvantage is that the achievable radiation intensity is less than the level required for applications where improved magnetometer sensitivity is desired. Another disadvantage is that optical pumping with a helium lamp is inefficient. The lamp emits all three spectral lines at 1083 nm, two of which pump counter the third, thereby reducing the achievable sensitivity of the helium magnetometer. An additional problem with helium lamp pumping is that the helium lamp is inefficient in conversion of electrical energy into pumping radiation at 1083 nm. A significant part of the electrical energy required to excite the lamp is wasted on heating the glass lamp walls and simultaneous excitation of a variety of unwanted and undesirable helium spectral lines. A still further disadvantage of helium lamp pumping is degraded magnetometer accuracy caused by the lamp radiation. Because the frequencies of the helium lamp radiation are not matched precisely to each corresponding absorption center frequency of the helium atoms in the resonance cell, the accuracy of the helium magnetometer is degraded since the pumping radiation appears to the helium isotope sample as the presence of an additional unwanted magnetic field in addition to the magnetic field to be measured.

It has been recognized that a single line laser radiation source could overcome the disadvantages of helium lamp pumping. However, during the first 25 years following the invention of the laser no suitable laser has been developed for this purpose. In recent years, the solid state laser has emerged as a radiation source. While the solid state laser does provide single line pumping, there are a number of disadvantages associated with its use in helium optical magnetometers. The list of disadvantages include the necessity for a relatively rare and expensive special-purpose neodymnium dopped laser crystal. Another disadvantage is that the laser crystal must be pumped by a high-power diode laser. Further, the solid state laser must be frequency stabilized by mechanically adjusting optical elements or in some cases the cavity length. To accommodate the laser crystal, the diode laser pump, and the frequency stabilization and tuning functions, the solid state laser cavities are of the order of ten centimeters in length. Yet another disadvantage is that additional expensive optical elements must be added to couple the radiation from the pump diode laser into the crystal and to couple the radiation from the laser source into an optical fiber which conducts the laser radiation to the helium isotope cell. Finally the extremely small alignment tolerances for all optical elements of the solid state laser result in a laser that is very difficult to mechanically package for the rough mechanical and thermal environment encountered by a portable helium magnetometer.

A need has thus arisen for a compact and efficient source of laser radiation for optical magnetometers which use a helium isotope as the resonance element. A need has further arisen for a laser radiation source which provides single mode, frequency stabilized radiation for optical magnetometers.

SUMMARY OF THE INVENTION

In accordance with the present invention, an electronically pumped semiconductor laser chip which emits single mode radiation at a frequency which is electronically frequency stabilized to the helium isotope absorption frequency is provided. The laser radiation source consists of a semiconductor laser chip which emits radiation in the wavelength absorption band of helium isotopes at 1083 nm. The radiation source provides single mode radiation at any desired helium isotope absorption line frequency $D_0$, $D_1$, or $D_2$ and has a spectral width comparable to or less than the width of the helium absorption line which is approximately 1.5 GHz.

In accordance with another aspect of the present invention, a current source provides current to electronically pump a laser, electronically stabilize the laser frequency and modulate the laser emission frequency. The laser radiation is directed into the helium isotope resonance sample and produces optical pumping which generates the optical magnetometer signal. By frequency modulating the laser over a band less than 100 Mhz, an optical error signal is produced which indicates the separation between the laser center frequency and the helium isotope absorption center frequency. The laser radiation source includes an electronic feedback loop consisting of a photodetector to convert the optical error signal into an electronic error signal and an electronic circuit to control the drive current to the semiconductor laser in order to stabilize the laser frequency on the desired helium absorption frequency by nulling the error signal.

The present invention avoids the deficiencies of helium lamp radiation sources by providing greatly improved magnetometer sensitivity through single line optical pumping, improved magnetometer accuracy by stabilizing the laser frequency on the helium isotope absorption frequency, and improved power efficiency by converting the electrical current directly to a single spectral line which is utilized by the optical magnetometer.

Additionally, the present invention provides for a radiation source for helium isotope magnetometers which has the advantages of single line laser pumping while avoiding the deficiencies of a solid state laser radiation source by using a semiconductor laser chip with a laser cavity less than 1 mm in length. Such a cavity eliminates the need for an expensive special purpose laser crystal and a high power diode laser to pump the crystal. The invention provides for direct electronic frequency control and stabilization, therefore eliminating the large laser cavity of the solid state laser which is required to contain the crystal and the mechanically controlled frequency selection elements. The invention provides for direct coupling of radiation from the laser chip to an optical fiber therefore avoiding the requirement for the optical elements required by the solid state laser radiation source to couple the diode laser radiation into the crystal and couple radiation from the laser cavity and the optical fiber.

The present radiation source an be configured in a rugged, compact, durable package for use in portable magnetometers which are subjected to rough and harsh mechanical and thermal environments.

BRIEF DESCRIPTION OF THE DRAWING

For a more complete understanding of the present invention and for further advantages thereof, reference is now made to the following Description of the Preferred Embodiments taken in conjunction with the accompanying Drawing which is a block diagram of a radiation source for an optical magnetometer utilizing the present invention.

DETAILED DESCRIPTION OF THE PREFERRED EMBODIMENTS

Referring to the Figure, a block diagram of a radiation source for an optical magnetometer, generally identified by the numeral 10 is illustrated. Radiation source 10 utilizes a semiconductor laser radiation source 12 in accordance with the present invention and circuitry for stabilizing the frequency of radiation source 12 to the desired helium isotope absorption frequency. The laser radiation source shown in the Figure is used for both isotopes $^3$He and $^4$He.

Semiconductor radiation laser source 12 comprises a diode laser chip semiconductor which emits radiation in the 1083 mm spectral region. Radiation source 12 may include a chip having multiple diode emitters and serves as a laser cavity with a length of 250 microns and is attached to a copper block 14 which serves as a thermal conductive path. The copper block 14 is mounted to a thermoelectric cooler 16 which is regulated by the thermoelectric cooler control 18 which maintains the temperature of laser source 12 at approximately 16.2 C. Radiation source 12, copper block 14, and cooler 16 are mounted to a TO-8 header.

A current source 20 supplies current to electrically drive semiconductor laser radiation source 12 to radiate a single mode line which has a linewidth comparable to or less than the linewidth of the helium absorption line which is approximately 1.5 GHz. The current source 20 is adjusted to supply approximately 252 mA to the diode laser chip which drives the laser source 12 to emit radiation at the frequency of the $D_0$ line of $^4$He which corresponds to a wavelength of 1082.91 nm. If desired, the $D_1$ or $D_2$ line could be selected by proper adjustment of the initial laser drive current.

The laser radiation generated by radiation source 12 is collimated by a lens 24, circularly polarized by a polarizing filter 26, and is directed to a resonance cell 30. A fiber optic cable may also be used for conducting radiation from source 12 to cell 30. The resonance cell 30 contains $^4$He at a pressure of about 7.5 torr. The helium atoms within cell 30 are excited by 27 MHz radiation form an rf exciter 32 to produce a sea of excited triplet metastable helium atoms within cell 30. The drive current provided by current source 20 to the semiconductor laser source 12 is used to tune the frequency of laser source 12 to the frequency of the absorbing helium atoms. The metastable helium atoms absorb the incident laser radiation, and optical pumping of the helium atoms within cell 30 takes place. The absorbed laser radiation is scattered out of cell 30 by re-emission, and the remaining laser radiation is transmitted through cell 30 to be monitored by a photodetector 34. Maximum absorption occurs when the center frequency of the laser radiation is the same as the center frequency of the $D_0$ absorption line of the metastable helium atoms.

The laser radiation frequency of laser source 12 is stabilized to the helium absorption frequency. The laser frequency varies with current at the rate of approximately 1 GHz/mA. The laser frequency also varies with temperature at the rate of about 20 GHz/degree C. Having stabilized the laser temperature at about 16.2 C. using thermoelectric cooler 16, drift in laser frequency from the helium absorption frequency is corrected by adjusting current source 20. The amount of adjustment is known from an optical error signal detected by photodetector 34. The error signal contains information which indicates the difference between the laser radiation frequency of laser source 12 and the helium absorption frequency.

Laser source 12 is frequency stabilized by a feedback loop which corrects the frequency difference between the laser frequency and the helium absorption frequency. The photocurrent from the photodetector 34 is applied to a transimpedance amplifier 40 and amplified. The amplifier output of amplifier 40 is directed to a phase sensitive demodulator 42 such as, for example, an Ithaco lock-in amplifier, which includes a narrow band amplifier set to pass 800 Hz signals. The output of demodulator 42 is a feedback voltage which is applied to a current modulator 44. The output of current modulator 44 is applied to the laser drive current source 20 which adjusts the laser drive current to null the frequency difference between the laser frequency of source 12 and the helium absorption frequency.

Laser source 12 is continuously frequency modulated by, for example, plus or minus 75 MHz or less about the laser line center frequency at a 800 Hz rate through operation of current modulator 44. This modulation moves the frequency of laser source 12 off the helium absorption peak and down alternating sides of the helium absorption curve. When the laser frequency of source 12 is identical to the helium absorption frequency, the laser beam through cell 30 is modulated at 1600 Hz with no 800 Hz component. When the laser frequency drifts away from the helium absorption frequency, a 800 Hz component is observed by photodetector 34 which has an amplitude proportional to the frequency difference and a phase which determines the direction of drift. The error signal is observed as a 800 Hz signal at photodetector 34.

Although the present invention has been described in terms of particular elements and particular arrangements, it is clear that different optical or electrical feedback methods or the use of different current and temperature variations to select and stabilize the laser radiation frequency may also be used.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A helium magnetometer comprising:
   a helium cell containing helium atoms at a predetermined energy state and an absorption frequency;
   a tunable semiconductor laser, tunable over a predetermined wavelength band for generating radiation to strike said helium cell and having a center frequency of operation;
   detector means for detecting radiation passing through said helium cell;
   a source of electrical current for applying current to said laser for stabilizing the frequency of said laser at a desired helium isotope absorption frequency; and
   feedback means interconnected between said detector means and said source of electrical current for generating an error signal applied to said source of electrical current for stabilizing the frequency of said laser to the helium absorption frequency.

2. The helium magnetometer of claim 1 wherein said feedback means includes:
   a demodulation circuit interconnected between said detector means and said source of electrical current.

3. The helium magnetometer of claim 1 and further including means for collimating and polarizing the radiation generated by said laser.

4. The helium magnetometer of claim 1 wherein said laser includes at least one semiconductor chip.

5. The helium magnetometer of claim 4 wherein said semiconductor chip includes at least one diode emitter.

6. A helium magnetometer comprising:
   a helium cell containing helium atoms at a predetermined energy state and an absorption frequency;
   a tunable semiconductor laser, tunable over a predetermined wavelength band for generating radiation to strike said helium cell and having a center frequency of operation;
   detector means for detecting radiation passing through said helium cell;
   a source of electrical current for applying current to said laser for stabilizing the frequency of said laser at a desired helium isotope absorption frequency;
   feedback means interconnected between said detector means and said source of electrical current for generating an error signal applied to said source of electrical current for stabilizing the frequency of said laser to the helium absorption frequency; and
   means for modulating the frequency of said laser by amplitude modulating the current supplied by said source of electrical current, said modulating means generating said error signal representing the difference between the center frequency of said laser and the helium absorption center frequency and further perturbing the population sublevels of the helium atoms within said cell.

7. The helium magnetometer of claim 6 wherein said feedback means includes:
   a demodulation circuit interconnected between said detector means and said modulating means.

8. The helium magnetometer of claim 6 and further including means for collimating and polarizing the radiation generated by said laser.

9. The helium magnetometer of claim 6 wherein said laser includes at least one semiconductor chip.

10. The helium magnetometer of claim 9 wherein said semiconductor chip includes at least one diode emitter.

11. The helium magnetometer of claim 6 and further including:
    an optical fiber disposed between said laser and said cell.

12. The helium magnetometer of claim 6 and further including:
    a semiconductor cooler connected to said laser.

13. The helium magnetometer of claim 6 wherein said predetermined wavelength band is selected from the group consisting of: 1082.91 mm, 1083.01 mm, and 1083.03 mm.

* * * * *